United States Patent
Nishioka et al.

[11] Patent Number: 6,147,020
[45] Date of Patent: Nov. 14, 2000

[54] LIGHT-IMPERMEABLE, HIGH PURITY SILICON CARBIDE MATERIAL, A LIGHT SHIELDING MEMBER FOR A SEMICONDUCTOR-TREATING APPARATUS, AND A SEMICONDUCTOR-TREATING APPARATUS

[75] Inventors: Masao Nishioka, Tokoname; Naotaka Kato, Owariasahi, both of Japan

[73] Assignee: NGK Insulators, Ltd., Nagoya, Japan

[21] Appl. No.: 09/412,959

[22] Filed: Oct. 5, 1999

[30] Foreign Application Priority Data

Oct. 7, 1998 [JP] Japan .................................. 10-285291

[51] Int. Cl.$^7$ .................................................. C04B 35/52
[52] U.S. Cl. ............................................................... 501/88
[58] Field of Search ................................ 501/88; 118/715

[56] References Cited

U.S. PATENT DOCUMENTS 5,937,316  8/1999  Inaba et al. ............................... 438/488

FOREIGN PATENT DOCUMENTS 10-12563  1/1998  Japan .

Primary Examiner—Deborah Jones
Assistant Examiner—Lymane Miranda
Attorney, Agent, or Firm—Burr & Brown

[57] ABSTRACT

A light-impermeable, high purity silicon carbide material including polycrystals of silicon carbide as a main ingredient, wherein the silicon carbide material has a porosity of not more than 0.1%, the content of each of metal elements contained in the silicon carbide material is not more than 200 ppb, a weight ratio of silicon relative to the entire weight of the silicon carbide material is 69.00 to 69.90 wt %, and a light transmittance of the silicon carbide material in a wavelength range of 0.4 to 25 $\mu$m is not more than 0.05% per a thickness of 0.5 mm.

6 Claims, 5 Drawing Sheets

LIGHT-IMPERMEABLE, HIGH PURITY SILICON CARBIDE MATERIAL, A LIGHT SHIELDING MEMBER FOR A SEMICONDUCTOR-TREATING APPARATUS, AND A SEMICONDUCTOR-TREATING APPARATUS

BACKGROUND OF THE INVENTION (1) Field of the Invention

The present invention relates to a light-impermeable, high purity silicon carbide material to be favorably used as a light shielding member for a semiconductor-treating apparatus.

(2) Related Art Statement

JP-A 10-12,563 discloses that a high-purity silicon carbide-based plate formed by a chemical vapor deposition in a thickness of 0.1 to 1 mm which has the maximum infrared ray transmittance of not more than 5% in the infrared zone is used as a member for thermally treating a semiconductor, and that this member is made of CVD-β-SiC columnar crystals having lengths of 0.1 to 1 mm and CVD-α-SiC particles having diameters of 0.5 to 5 μm and existing among the columnar crystals. This further discloses that a film of silicon carbide is produced by the chemical vapor deposition, while a raw gas is being fed onto a substrate in a reaction tube and that at that time the high purity CVD silicon carbide film is formed on the substrate at a treating temperature of 100 to 1150° C. while intermittently feeding the raw gas at an time interval of not more than 60 seconds and a ratio between the maximum gas feed rate and the minimum gas feed rate is set at not more than 5, and then the substrate is separated from the film. The member for thermally heating the semiconductor as disclosed in JP-A 10-12,563 has the maximum infrared transmittance of not more than 5% at the thickness of 0.1 to 1 mm, and it is around 1% in Examples.

However, the following problem occurred during the inventors' measurement of the temperatures in the semiconductor-producing apparatuses by using the infrared radiation thermometer. This problem will be explained with reference to a schematic view of FIG. 1.

A susceptor 4 for receiving a peripheral portion of the semi-conductor is supported on an end of a cylinder 5 made of silicon, and a peripheral portion 7a of a seminconductor wafer 7 is supported on the susceptor 4. A heat source (infrared lamp) 1 for heating the semiconductor wafer through a quartz window 2 is arranged at one face side 7a of the semiconductor wafer 7. The other face side 7c of the semiconductor wafer 7 is exposed to a rear face side through a center opening 4a of the susceptor 4. The infrared radiation thermometer 6 is arranged on the other face side of the semiconductor wafer 7. The semiconductor wafer 7 is heated from one face side with the radiation heat from the hear source 1, the infrared rays radiated from that zone 7c of the semiconductor wafer 7 which is not in contact with the susceptor 4 are measured by an infrared radiation thermometer 6, and the measurement values are fed back to the heat source.

However, the actual production of such apparatuses proved difficult it to make the feed-back control. That is, a part of the infrared rays from the infrared lamp 1 entered the infrared radiation thermometer 6 through the susceptor 4 to make the thermometer give a wrong indication temperature. The temperature of the semiconductor wafer needs to be controlled within an extremely high precision of, for example, ±0.5° C. Therefore, suppressing the infrared transmittance of the susceptor 4 to around 1% is certainly sufficient in improving the heat response of the susceptor, but causes a large error in the indication temperature of the infrared radiation thermometer with the result that the temperature varies at the wafer and the treated state of the wafer varies within the wafer surface.

SUMMARY OF THE INVENTION

It is an object of the present invention to provide a high purity silicon carbide material having a low light transmittance for light beams having wavelengths in the infrared zone and the near infrared zone.

The present inventors discovered that in a high purity silicon carbide material comprising polycrystals of silicon carbide as a main ingredient, when the silicon carbide material has a porosity of not more than 0.1%, the content of each of any metal elements contained in the silicon carbide material is not more than 200 ppb, and a weight ratio of silicon relative to the entire weight of the silicon carbide material is 69.00 to 69.90wt %, a light transmittance of the silicon carbide material in a wavelength range of 0.4 to 25 μm is not more than 0.05% per a thickness of 0.5 mm.

Assuming that ideal silicon carbide has completely no impurities, the weight ratio of silicon in this silicon carbide is 70.05 wt % as calculated from the molecular weight ratio between carbon and silicon. Since the silicon carbide material according to the present invention which possesses an extremely high purity and less pores as mentioned above has the weight ratio of silicon suppressed as mentioned above, the light transmittance is remarkably reduced, and practical strength can be maintained.

Further, the present invention also relates to a light-shielding member to be set in a semiconductor-producing apparatus, which comprises the above high purity silicon carbide material as a substrate. The present invention also relates to semiconductor-treating apparatus comprises this light-shielding member.

The porosity of the silicon carbide material according to the present invention is not more than 0.1%, and is a dense polycrystal body substantially free from pores. Since the silicon carbide material has substantially no pores, the silicon carbide material does not adsorb or desorb a gas particularly within a heating vacuum chamber of the semiconductor-producing apparatus, so that it does not cause influence upon the semiconductor-treating process.

The light transmittance is measured by a Fourier conversion infrared spectrophotometer ("Spectrum 2000" manufactured by Parkin Elmer Co., Ltd.). More specifically, a sample having a dimension of about 20 mm×20 mm×0.5 mm in thickness was prepared, and its opposite main planes are polished to 0.01 μm with a #80 diamond grinding stone. A background datum is taken by measuring the infrared transmittance of air though passing a laser beam in the state that nothing is placed at a sample holder of the light transmittance measurement device. Next, the sample prepared above is placed at the sample holder, and the infrared transmittance of the sample is measured by passing the laser beam through the sample. The thus obtained measurement result is compared with the background datum. The infrared transmittance of the sample is calculated, while that of air is taken as 100%. The transmittance itself is automatically calculated by the above device. Since the measurement error of the infrared transmittance measuring apparatus is not more than 0.05%, the transmittance of the silicon carbide material being not more than 0.05% means that this transmittance is within the measurement error and substantially no rays pass the sample.

The concentration of each of any metallic impurities in the silicon carbide material according to the present invention is not more than 200 ppb. This concentration is equal to or less than that in the conventional light-permeable high purity silicon carbide. It is considered that the silicon carbide according to the present invention is light-impermeable not by doping it with impurities, but some unbalance between silicon and carbon increases the concentration of defects in the crystals so that a number of levels having small energy gaps are formed to make the silicon carbide material to absorb beams over a wide wavelength range, which makes the material light-impermeable.

These and other objects, features and advantages of the invention will be apparent from the reading of the following description of the invention when taken in conjunction with the attached drawings, with the understanding that some modifications, variations and changes could be made by the skilled person in the art to which the invention pertains.

BRIEF DESCRIPTION OF THE DRAWINGS

For a better understanding of the invention, reference is made to the attached drawings wherein.

DETAILED DESCRIPTION OF THE INVENTION

The present invention will be explained in more detail with reference to the attached drawings.

Figure 2:
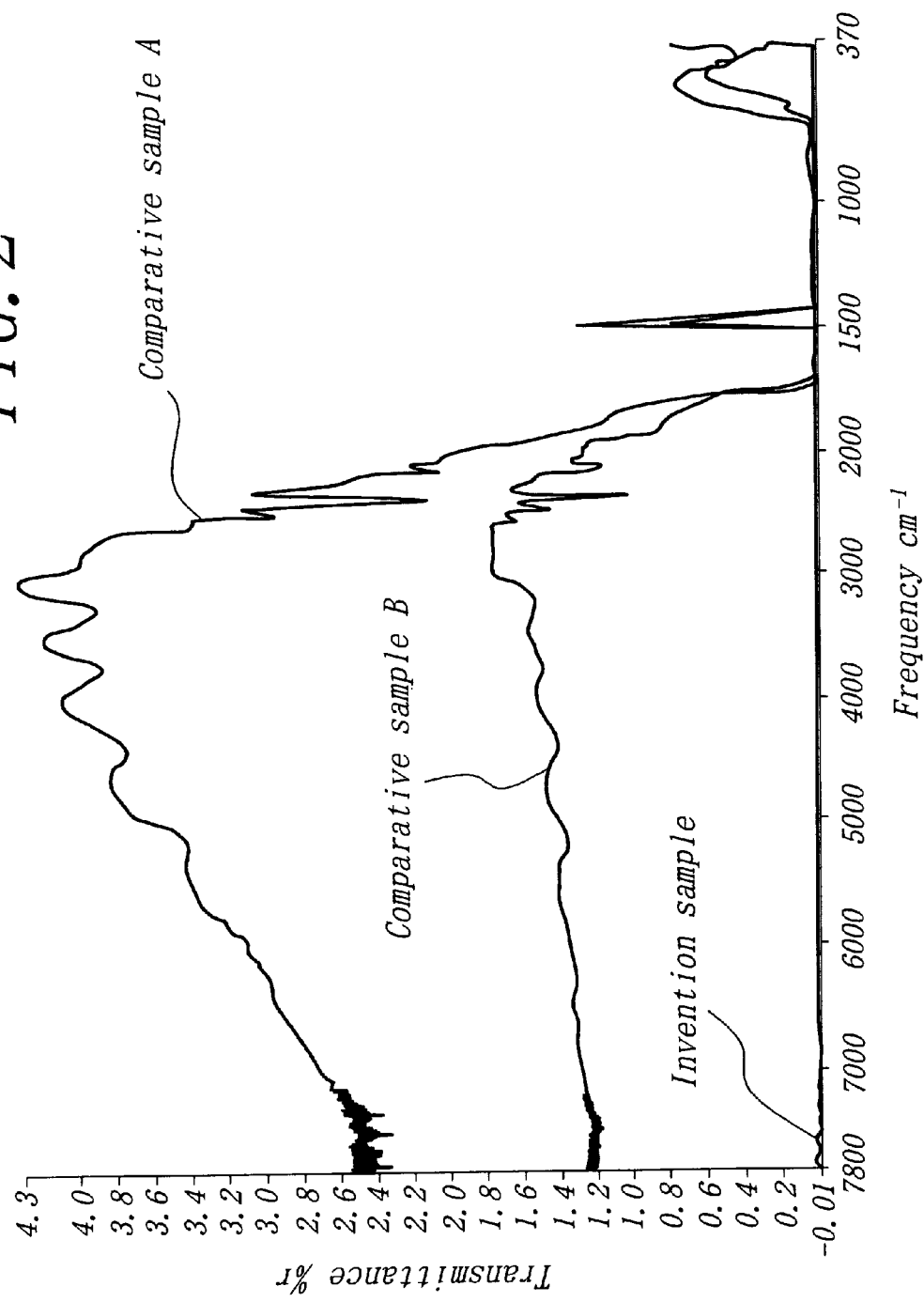
FIG. 2 is a graph showing the relationship between the light transmittance and the wavelength of each of silicon carbide materials as an invention sample and comparative samples A and B.

In FIG. 2 is shown a graph showing measurement results of the light transmittances of silicon carbide materials as comparative samples A and B and an invention sample mentioned later. It is surprising that the silicon carbide material according to the present invention does not exhibit the light permeability at all over an extremely wide wavelength range.

Further, present inventors made measurements of the silicon carbide film as the comparative sample and the silicon carbide material as the invention sample by the X-ray diffraction method. Measurement condition and measurement results are given in FIGS. 3 and 4. A measurement result of the comparative example shown in FIG. 3 reveals that since polycrystals of silicon carbide are oriented in the [111] plane and therefore the intensity of a [111] plane peak is large, the silicon carbide sample has a microstructure in which the columnar crystals of silicon carbide grew in a direction perpendicular to the silicon carbide film. To the contrary, as shown in FIG. 4, for example, peaks are clearly observed corresponding to the [200] plane, the [220] plane and the [311] plane, respectively in the invention sample, their intensity ratio is substantially equivalent to that of β-SiC powder in an X-ray diffraction profile according to the JCPDS card. That is, since the silicon carbide material according to the present invention has a low oriented degree as viewed microstructurally, the light is easily scattered, and difficult to pass.

When the intensity of the peak corresponding to the [311] plane of the silicon carbide material is taken as 1.0 as measured by the X-ray diffraction method, the intensity of the peak corresponding to the [111] plane is particularly preferably 0.9 to 4.0. This is more particularly preferably 1.2 to 2.0.

It is preferably that the silicon carbide material is produced by forming a film of silicon carbide on a substrate as mentioned later and removing the substrate from the film. At the time, the following substrates may be preferably used.

Graphite, silicon carbide sintered body, carbon sheet, carbon felt, Si-SiC (Si metal-SiC composite material), recrystallized SiC Among them, graphite is particularly preferable because it is a low cost, has excellent self-shape keeping ability, and is easily to remove.

The above silicon carbide material may be produced by any one of the following methods.

(1) A film of silicon carbide is formed on a substrate by the chemical vapor deposition. At that time, the film-forming temperature is set at not less than 1,400° C. and not more than 1,450° C., $SiCl_4$ and $CH_4$ are used together with argon and hydrogen as carrier gases. Each of these gases is fed into a chemical vapor deposition furnace. At that time, ratios in the flow rates are adjusted as shown below, while the pressure is set at 50 to 400 Torr. The figure giving the flow rate ratio is a volume ratio of gases in the standard state.

$$0.9 \leq SiCl_4/CH_4 \leq 1.05$$

$$0.14 \leq SiCl_4/(Ar+H_2) \leq 0.36$$

(2) A film of silicon carbide is formed on a substrate according to the chemical vapor deposition. At that time, the film-forming temperature is set at not less than 1,320° C. and not more than 1,380° C., $SiCl_4$ and $CH_4$ are used together with argon and hydrogen as carrier gases. Each of these gases is fed into a chemical vapor deposition furnace. At that time, ratios in the flow rates are adjusted as shown below, while the pressure is set at 50 to 400 Torr. The figure giving the flow rate ratio is a volume ratio of gases in the standard state.

$$0.90 \leq SiCl_4/CH_4 \leq 1.05$$

$$0.140 \leq SiCl_4/(Ar+H_2) \leq 0.46$$

(3) A film of silicon carbide is formed on a substrate according to the chemical vapor deposition. At that time, the film-forming temperature is set at not less than 1,250° C. and not more than 1,310° C., $SiCl_4$ and $CH_4$ are used together with argon and hydrogen as carrier gases. Each of these gases is fed into a chemical vapor deposition furnace. At that time, ratios in the flow rates are adjusted as shown below, while the pressure is set at 50 to 400 Torr. The figure giving the flow rate ratio is a volume ratio of gases in the standard state.

$$0.90 \leq SiCl_4/CH_4 \leq 1.60$$

$$0.10 \leq SiCl_4/(Ar+H_2) \leq 0.40$$

As the film-forming temperature lowers, the film-forming speed substantially decreases. On the other hand, as the film-forming temperature rises, the film-forming speed increases. However, in order to produce a member not allowing permeation of the infrared rays, it is necessary to set the ratio of $SiCl_4/CH_4$ in the raw gases to not more than 1.05. If the ratio of $SiCl_4/CH_4$ is less than 0.90, free graphite is precipitated at grain boundaries of silicon carbide, so that the polycrystals of silicon carbide are separate from one another to rapidly decrease strength of the silicon carbide material. Further, when the silicon carbide material is heated in an argon atmosphere containing 5% of oxygen, carbon portions are oxidized, so that small pores are formed at the surface of the silicon carbide film to cause gases to be adsorbed onto or desorbed from the film to an unignorable degree. If the gas is adsorbed or desorbed like this, the reproductivity of the semiconductor-treating process is conspicuously deteriorated.

If the ratio of $SiCl_4/(Ar+H_2)$ is over 0.40, the film allows the infrared rays to pass it, whereas if it is less than 0.10, graphite is likely to precipitate, which makes the film unsuitable for use.

Further, it is discovered that if the film-forming temperature is not less than 1,320° C. and not more than 1,380° C., reduction in the strength of the film after heating at a high temperature in air is the minimum.

Figure 5:
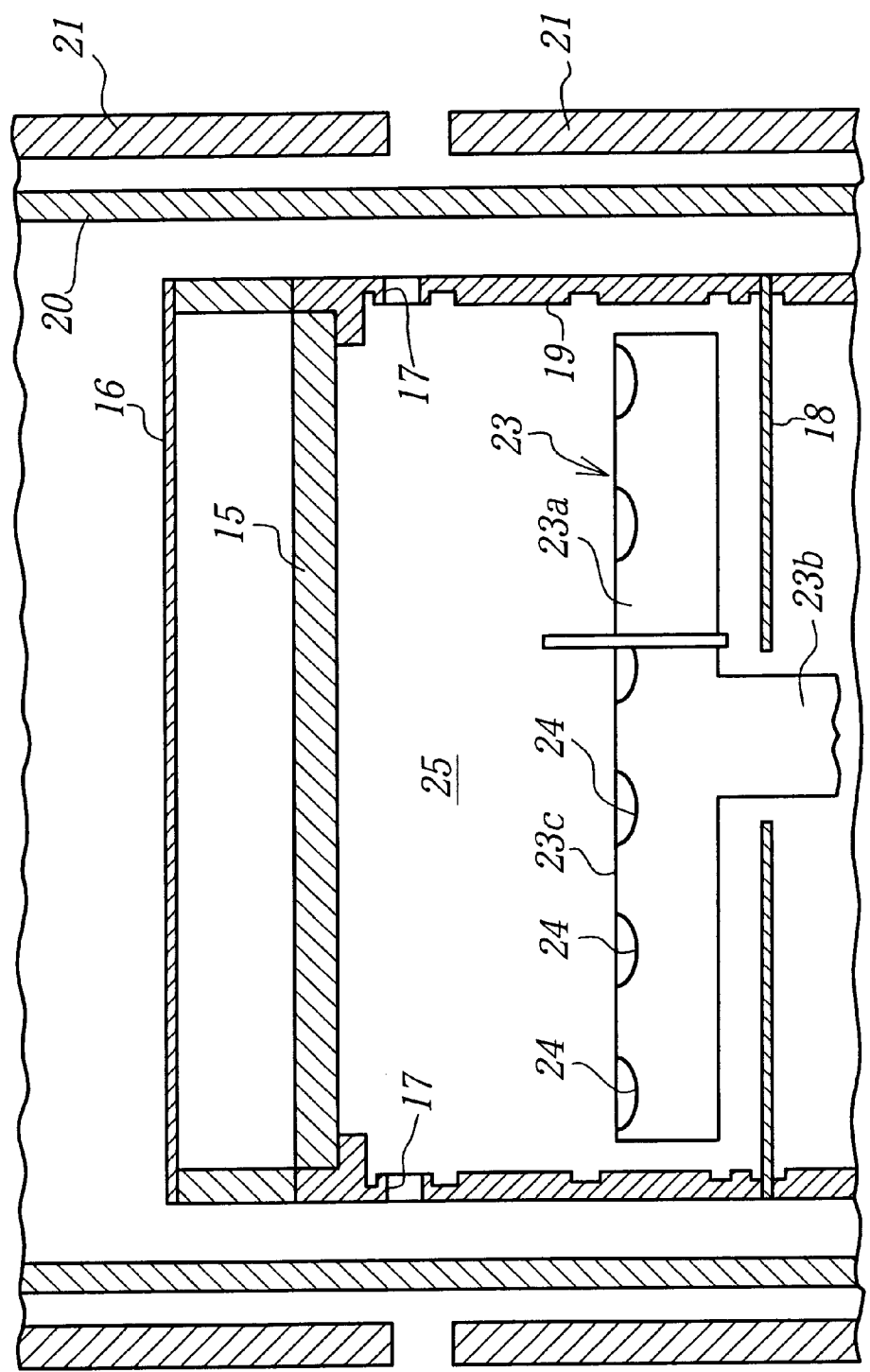
FIG. 5 is a schematically sectional view showing an apparatus suitable for producing a silicon carbide material according to the present invention by chemical vapor deposition.

FIG. 5 schematically shows a favorable chemical vapor deposition (CDV) furnace. A given substrate 15 is placed in this furnace, and the substrate 15 is supported by a holding jig 19. Reference numerals 16 and 18 also denote jigs. In this embodiment, a raw material feed pipe 23 having a T-shaped front form is arranged, which includes a laterally extending blowout portion 23a and a base portion 23b. A given number of gas ejecting openings 24 are provided at a surface side 23c of the blow-out portion 23a opposed to the substrate. Reference numerals 20 and 21 denote an inner cylinder of the furnace and an exterior heater, respectively.

The distance between the surface 23c of the raw feed pipe 23c of the raw material feed pipe 23 and the substrate 15 is set at 100 mm to 300 mm, for example. While the raw material feed pipe 23 is under rotation, gases are ejected through the gas ejecting openings 24. The raw gases for the CVD are ejected through the gas ejecting openings 24, flow a space 25, impinges upon and flows along the surface of the substrate 15, and discharged through 15 gas exhaust holes 17 provided in the holding jig 19.

When the raw material feed pipe 23 thus configured is used and the gases are ejected under rotation of this feed pipe 23, the thickness of a film of silicon carbide covering the entire surface of the substrate 15 can be made uniform.

(EXAMPLES )

(Experiment A)

A film of silicon carbide was formed according to the above-mentioned method by using the CVD apparatus shown in FIG. 5. A discoidal substrate made of graphite with a diameter of 400 mm and a thickness of 30 mm was used. A film of silicon carbide was formed on the substrate under a condition given in Table 1 or 2. In each Table, a flow rate ratio of silicon tetrachloride/methane $(SiCl_4+CH_4)$ a flow rate ratio of silicon tetrachloride/(argon+hydrogen) $(SiCl_4/(Ar+H_2))$ and a film-forming temperature are given. The pressure in film forming was 180 Torr.

Argon was fed as a carrier gas during temperature rising. Then, the temperature was kept at the film-forming temperature. After the above raw gases were introduced for a given time period, the interior of the CVD furnace was replaced and cooled with argon gas. After cooling, the graphite substrate formed with a film of silicon carbide was taken out from the furnace. The graphite substrate was ground off, and the resulting silicon carbide film was ct to obtain a rectangular silicon carbide film having a dimension of 0.50 mm thickness and 20 mm×20 mm square. Each of the thus obtained silicon carbide materials are polished to render its center line average height Ra to 0.01 μm or less. The light transmittance was measured at a frequency of 400/cm to 7800/cm in a medium infrared range (wavelength range: 1.28 to 25 μm) by using the Fourier conversion infrared spectrophotometer. The light transmittance was also measured in a wavelength range of 0.4 to 25 μm by using a spectrometer.

In each Table, a measurement result of the maximum light transmittance in a wavelength range of 0.4 to 25 μm was given for each sample. A weight ration of silicon relative to the entire weight of the silicon carbide material was also given. The silicon carbide material was dissolved in a mixed solution of hydrofluoric acid and nitric acid at a high temperature under high pressure, The weight ratio (wt %) of the silicon was determined by an absolute analysis method. The crystalline phase was examined by the X-ray diffraction method. The porosities of all the silicon carbide materials were measured to be 0.1% or less by Archimedean method. A bar having a dimension of 4 mm×4 mm×50 mm was cut out from each silicon carbide for testing bending strength, which was heated at 1,000° C. for 12 hours. Thereafter, strength of the bar was measured by a four-point bending method. The content of each metallic element was measured by microanalysis based on the GD-MS method (glow discharge-macrospectroscopy method). Results are shown in Table 3.

TABLE 1

| Test No. | Silicon tetrachloride/ Methane | Silicon tetrachloride/ Argon & hydrogen | Film-forming temperature (° C.) | Light transmittance (%) | Weight ratio of silicon to the entire weight of SiC material (wt %) | Analysis by X-ray diffraction | Intensity ratio of (111)/(311) | Strength after heating in air (MPa) |
|---|---|---|---|---|---|---|---|---|
| Prior art | — | — | — | 3–4 | 70.04 | silicon carbide | — | 500 |
| 1 | 1.0 | 0.25 | 1500 | 2 | 70.13 | silicon carbide | 12 | 480 |
| 2 | 1.3 | 0.25 | 1400 | 2.5 | 70.13 | silicon carbide | 11 | 460 |
| 3 | 1.0 | 0.05 | 1400 | 0.8 | 70.08 | silicon carbide | 12 | 480 |
| 4 | 0.8 | 0.25 | 1400 | less than 0.05 | 68.55 | silicon carbide/carbon | 2.1 | 70 |
| 5 | 0.8 | 0.25 | 1300 | less than 0.05 | 68.46 | silicon carbide/carbon | 1.7 | 80 |

TABLE 1-continued

| Test No. | Silicon tetrachloride/ Methane | Silicon tetrachloride/ Argon & hydrogen | Film-forming temperature (° C.) | Light transmittance (%) | Weight ratio of silicon to the entire weight of SiC material (wt %) | Analysis by X-ray diffraction | Intensity ratio of (111)/(311) | Strength after heating in air (MPa) |
|---|---|---|---|---|---|---|---|---|
| 6 | 1.0 | 0.25 | 1300 | less than 0.05 | 69.79 | silicon carbide | 2.7 | 470 |
| 7 | 1.6 | 0.25 | 1300 | less than 0.05 | 69.81 | silicon carbide | 1.8 | 380 |

TABLE 2

| Test No. | Silicon tetrachloride/ Methane | Silicon tetrachloride/ Argon & hydrogen | Film-forming temperature (° C.) | Light transmittance (%) | Weight ratio of silicon to the entire weight of SiC material (wt %) | Analysis by X-ray diffraction | Intensity ratio of (111)/(311) | Strength after heating in air (MPa) |
|---|---|---|---|---|---|---|---|---|
| 8 | 1.0 | 0.25 | 1400 | less than 0.05 | 69.85 | silicon carbide | 1.6 | 360 |
| 9 | 0.9 | 0.25 | 1400 | less than 0.05 | 69.72 | silicon carbide | 2.4 | 280 |
| 10 | 1.0 | 0.14 | 1400 | less than 0.05 | 69.87 | silicon carbide | 3.6 | 410 |
| 11 | 1.0 | 0.36 | 1400 | less than 0.05 | 69.02 | silicon carbide | 1.8 | 320 |
| 12 | 1.0 | 0.25 | 1350 | less than 0.05 | 69.85 | silicon carbide | 1.6 | 520 |
| 13 | 0.9 | 0.25 | 1300 | less than 0.05 | 69.87 | silicon carbide | 2.3 | 420 |
| 14 | 1.0 | 0.14 | 1350 | less than 0.05 | 69.88 | silicon carbide | 1.8 | 500 |
| 15 | 1.0 | 0.36 | 1350 | less than 0.05 | 69.63 | silicon carbide | 2.5 | 480 |

TABLE 3

| Metal | Al | Fe | Ti | Ca | Mg | K | Na |
|---|---|---|---|---|---|---|---|
| Content ppb | 46 | 30 | less than 10 | less than 10 | 8 | less than 10 | less than 10 |
| Metal | Cr | Mn | Co | Ni | Cu | Zn | B |
| Content ppb | less than 50 | 5 | less than 5 | 60 | 49 | less than 30 | less than 30 |

A prior art product in Table 1 is a sample cut out from a commercially available silicon carbide film chemical vapor deposited and having the above dimension and shape.

JP-A 10-12,563 gives an infrared transmittance of not less than 5% for prior art products.

FIG. 2 is a graph giving light transmittance in a medium infrared range for each of silicon carbide materials in Test No. 12 (invention sample), Comparative sample A (Prior art example) ad Comparative sample B (Test No. 1), respectively.

Figure 3:
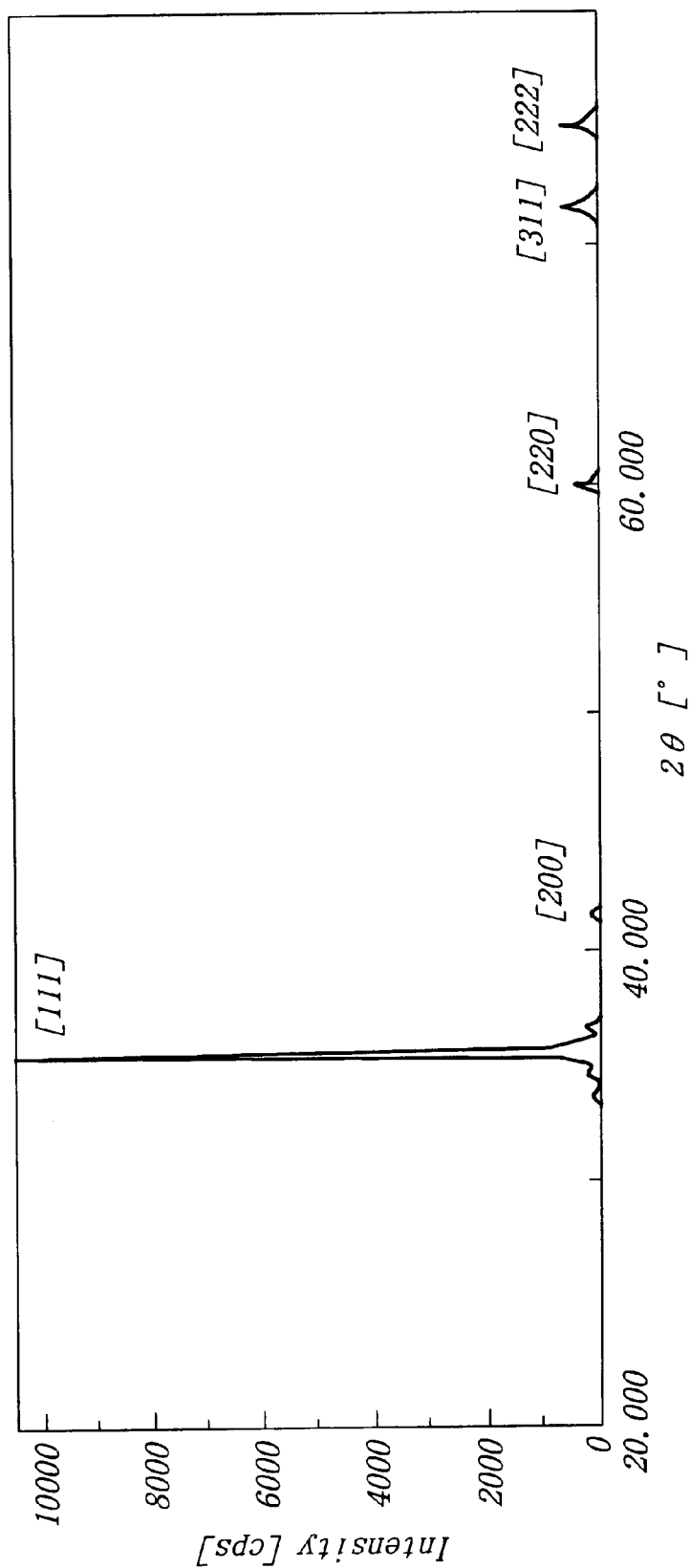
FIG. 3 is a graph showing an X-ray diffraction result of the silicon carbide material as a comparative sample.
Figure 4:
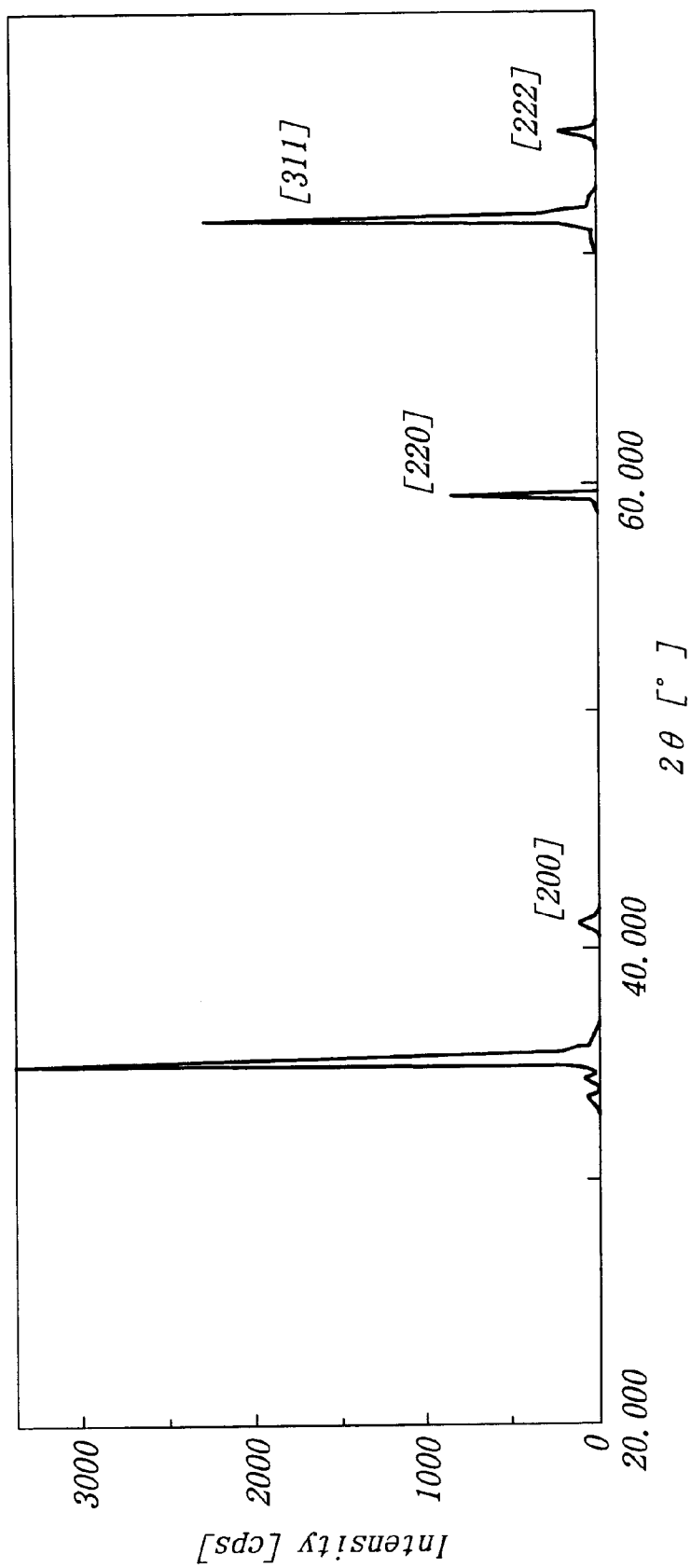
FIG. 4 is a graph showing an X-ray diffraction result of the silicon carbide material as the invention sample.

FIG. 3 shows a measurement result by the X-ray diffraction method for Comparative sample (Test No. 1), and FIG. 4 shows a measurement result by the X-ray diffraction method for the invention sample (Test No. 12).

(Experiment B)

Figure 1:
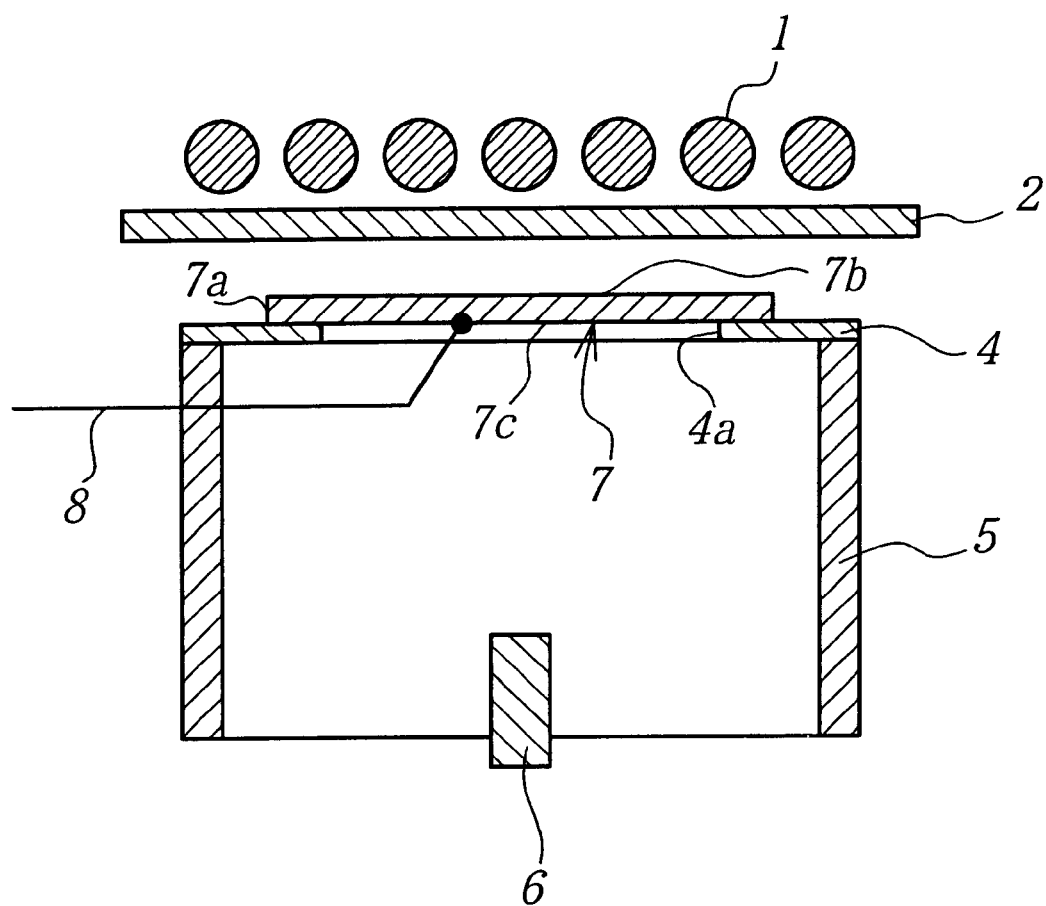
FIG. 1 is a schematic view showing a semiconductor-treating apparatus in which the silicon carbide material according to the present invention is usable.

A wafer-holding susceptor 4 as shown in FIG. 1 was produced from each of an invention sample and a comparative sample. The silicon carbide material as the invention sample was produced in the same manner as in Test No. 12 of Experiment A. The silicon carbide material as the comparative sample was produced in the same manner as in Test No. 1. The annular susceptor 4 was cut out from each silicon carbide material. The susceptor 4 had a dimension of an outer diameter: 250 mm, an inner diameter: 180 mm and a thickness: 0.50 mm. The susceptor 4 was arranged on one end of a silicon cylinder 5 having an outer diameter of 250 mm and an inner diameter of 240 mm.

A silicon wafer 7 was placed on the susceptor 4, and was heated through a quartz window 2 by an infrared lamp 1. A thermocouple 8 having a wire diameter of 0.1 mm was placed to contact the wafer 7 at an arbitrary point. An infrared radiation thermometer 6 was arranged such that an axis of the infrared radiation thermometer 6 may pass a point of a circle which is drawn around the center of one surface of the silicon wafer 7 and which passes a contact point of the thermocouple 8 to the silicon wafer 7. The infrared radiation thermometer 6 was so sufficiently spaced from the wafer that the thermometer 6 might not be damaged by heating. In this state, the temperature of the wafer 7 was measured, while the wafer 7 was being heated with the infrared heating lamp 1 under argon atmosphere. Measured temperatures are shown in Table 4.

TABLE 4

| Measuring position (Distance from the center of wafer) (mm) | Temperature of thermocouple (° C.) | Temperature measured by infrared radiation thermometer, (° C.) | |
|---|---|---|---|
| | | Invention | Prior art |
| 0 | 500 | 501 | 508 |
| 0 | 1000 | 1002 | 1021 |
| 80 | 500 | 501 | 519 |
| 80 | 1000 | 1002 | 1047 |

As is clear from Table 4, if the silicon carbide material as the comparative sample is used, there is a tendency that the temperatures measured by the infrared radiation thermometer are higher as a whole, and that the measured temperatures near the outer peripheral portion of the wafer are remarkably higher. This shows that the light from the infrared lamp enters the infrared radiation thermometer through the susceptor. On the other hand, if the susceptor as the invention susceptor is used, the light from the infrared lamp can be interrupted, so that the temperature can be measured accurately in a non-contact manner without using the thermocouple. This enables the heating with the infrared lamp to be accurately controlled, which realizes the semiconductor-treating process with a high precision and high reproductivity. Use of plural heating lamps can result in uniform heating the wafer and minimize the temperature variations at the surface of the wafer in heating it.

As mentioned above, the silicon carbide material according to the present invention is highly pure, and almost completely prevents permeation of the infrared rays and far infrared rays.

What is claimed is:

1. A light-impermeable, high purity silicon carbide material comprising polycrystals of silicon carbide as a main ingredient, wherein the silicon carbide material has a porosity of not more than 0.1%, the content of each of metal elements contained in the silicon carbide material is not more than 200 ppb, a weight ratio of silicon relative to the entire weight of the silicon carbide material is 69.00 to 69.90 wt %, and a light transmittance of the silicon carbide material in a wavelength range of 0.4 to 25 μm is not more than 0.05% per a thickness of 0.5 mm.

2. The light-impermeable, high purity silicon carbide material set forth in claim 1, wherein a peak intensity of the silicon carbide material corresponding to a [111] plane is 0.9 to 4.0 as measured by an X-ray diffraction method, provided that a peak intensity corresponding to a [311] of the silicon carbide material is taken as 1.0.

3. A light-shielding member to be set in a semiconductor-producing apparatus, which comprises the light-impermeable, high purity silicon carbide material set forth in claim 1 as a substrate.

4. The light-shielding member set forth in claim 3, which is an annular susceptor on which a peripheral portion of a semiconductor is to be placed.

5. A semiconductor-treating apparatus comprises the light-shielding member set forth in claim 3.

6. The semiconductor-treating apparatus set forth in claim 5, wherein the light shielding member is an annular susceptor on which a peripheral portion of a semiconductor is to be placed, a heat source provided at one face side of the semiconductor to heat the semiconductor on the susceptor, and an infrared radiation thermometer arranged at the other face side of the semiconductor, whereby the seminconductor is heated from said one side with a radiation heat from the heat source, and infrared rays radiated from that portion of the semiconductor which does not contact the susceptor are measured by the infrared radiation thermometer.

* * * * *